United States Patent [19]
Yorksie

[11] 3,979,657
[45] Sept. 7, 1976

[54] BATTERY MONITOR WITH AUTOMATIC SCALE AND RECYCLE PREVENTS

[75] Inventor: Daniel S. Yorksie, Pittsburgh, Pa.

[73] Assignee: Westinghouse Electric Corporation, Pittsburgh, Pa.

[22] Filed: Aug. 22, 1975

[21] Appl. No.: 607,010

Related U.S. Application Data

[63] Continuation of Ser. No. 360,698, May 15, 1973, abandoned.

[52] U.S. Cl. .................................... 320/13; 320/48; 340/248 B; 340/249
[51] Int. Cl.² ......................................... H01M 10/48
[58] Field of Search .................. 320/13, 39, 40, 48; 340/248 B, 249; 317/9 BP

[56] References Cited
UNITED STATES PATENTS

| | | | |
|---|---|---|---|
| 2,782,357 | 2/1957 | Heyer et al. ....................... | 320/48 X |
| 2,999,980 | 9/1961 | Barnes ........................... | 320/48 UX |
| 3,522,481 | 8/1970 | Terzic ............................. | 320/40 X |
| 3,529,230 | 9/1970 | Tedd ................................ | 320/48 |
| 3,568,175 | 3/1971 | Schwer et al. ..................... | 320/48 X |

Primary Examiner—Miller J D
Assistant Examiner—Robert J. Hickey
Attorney, Agent, or Firm—J. B. Hinson

[57] ABSTRACT

A monitor for disabling a selected operative function of the battery powered vehicle when the battery reaches a predetermined discharge state is disclosed. The discharge state of the battery is determined by continuously monitoring the terminal voltage of the battery. Automatic scaling circuitry is included so that the monitor automatically adjusts to the range which is appropriate for the battery being monitored. Two warning signals are generated with each warning signal indicating a progressively lower discharge state of the battery. After the second warning signal has been on for a predetermined time period, a selected operative function of the vehicle is disabled. If the vehicle is a fork-lift truck for example, the lift mechanism might be disabled however the main drive motor could remain operative so that the truck could be returned to the battery charging station. The monitor also prohibits the disabled function from being reenergized except when a fully charged battery is installed in the vehicle.

9 Claims, 4 Drawing Figures

BATTERY MONITOR WITH AUTOMATIC SCALE AND RECYCLE PREVENTS

This is a continuation of application Ser. No. 360,698 filed May 15, 1973, now abandoned.

BACKGROUND OF THE INVENTION

1. Field of the Invention

This invention relates to voltage monitors and more particularly to apparatus for monitoring the terminal voltage of a battery which supplies power for operating an electrically powered vehicle and for disabling a selected operative function of the vehicle when the battery reaches a predetermined discharge state.

SUMMARY OF THE INVENTION

In battery powered vehicles, for example a fork lift truck, it is desirable to insure that the operator will return the vehicle to the battery charging station so that the battery can be recharged when the battery reaches a predetermined discharge state. Selected operative functions of the vehicle should also be disabled until a fully charged battery is installed in the vehicle. Several difficulties are encountered in designing a monitor to assure that the vehicle is operated in this manner. For example, batteries in these applications are often subjected to short but rather heavy loads which cause the terminal voltage of the battery to momentarily drop quite significantly. Once the temporary load has been removed the battery terminal voltage will begin to recover to normal. However, the recovery rate will depend on the extent of the load, the charge condition of the battery and the duration of the load. There may also be switching transits which are generated as the controller is turned on and off. These characteristics mean that the charge condition of the battery cannot be determined by simply monitoring the terminal voltage of the battery.

The monitor should also be designed such that once the selected operative function of the vehcile has been disabled it cannot be reenabled until the battery terminal voltage exceeds a predetermined value. A particular vehicle may be capable of operating on a variety of battery voltages. This makes it desirable that the monitor be capable of monitoring a reasonable variety of battery voltage. Ideally the monitor should include an automatic scaling circuit so that no adjustment or circuit changes are required to the scale of the monitor.

The disclosed monitor includes a circuit which requires that the battery voltage exceeds a first threshold level before a selected operative function of the vehicle is enabled. After the selected operative function has been enabled the terminal voltage of the battery is continually compared to a second threshold and a first warning indicator is turned on if the battery terminal voltage falls below this level. At the same time that the first warning indicator is turned on, a first timing circuit is initiated to generate a signal which defines a first time interval. If the battery load recovers to a third threshold level before the time interval determined by the first timing circuit expires, the first warning is cancelled and normal operation is continued. However, if the battery voltage does not recover to the third threshold level during this period a second warning signal is turned on and a second timer circuit is initiated to generate a signal which defines a second time interval. If the battery voltage returns to a fourth threshold level during the second time interval the warning functions are cancelled and operation is returned to normal. However if the battery voltage does not return to the fourth threshold level during the second time interval, the selected operative function of the vehicle is disabled and normal operation can only be restored by installing a charged battery in the vehicle.

The terminal voltage of the battery is also continuously compared to a fifth threshold and the selected operative function of the vehicle disabled without substantial delay if the terminal voltage falls below this threshold.

The selected operative function may be re-enabled by two methods depending on how it was disabled. If it was disabled after the second warning signal persisted for a time interval specified by the second timer, the terminal voltage must rise above the fourth threshold before this operative function is re-enabled. If the disable occurred without warning because the terminal voltage decreased to or below the fifth threshold level, the terminal voltage must rise above the first threshold level before the operative function is re-enabled.

The various thresholds are independently adjustable. The first threshold is normally set to be substantially equal to the maximum terminal voltage of the battery. The fifth threshold is normally set below the expected operating range of the battery. Selecting these threshold levels in this manner means that during expected operating conditions the only time the operative function of the vehicle will be controlled by the first and fifth thresholds will be when the battery is disconnected from the monitor because it is being charged or for some other reasons. The other threshold levels and time intervals are selected to insure that the battery is not over discharged before the operative function is disabled.

The monitor also includes an automatic scaling circuit which selects the operating range of the monitor. Operation of this circuit is totally automatic and requires no manual adjustments or circuit modifications to change the scale of the monitor.

Although the invention is described with reference to a fork lift truck it should be obvious that the battery monitor can be utilized in other equipment which depends on electric storage batteries as a source of energy.

DETAILED DESCRIPTION

Figure 1:
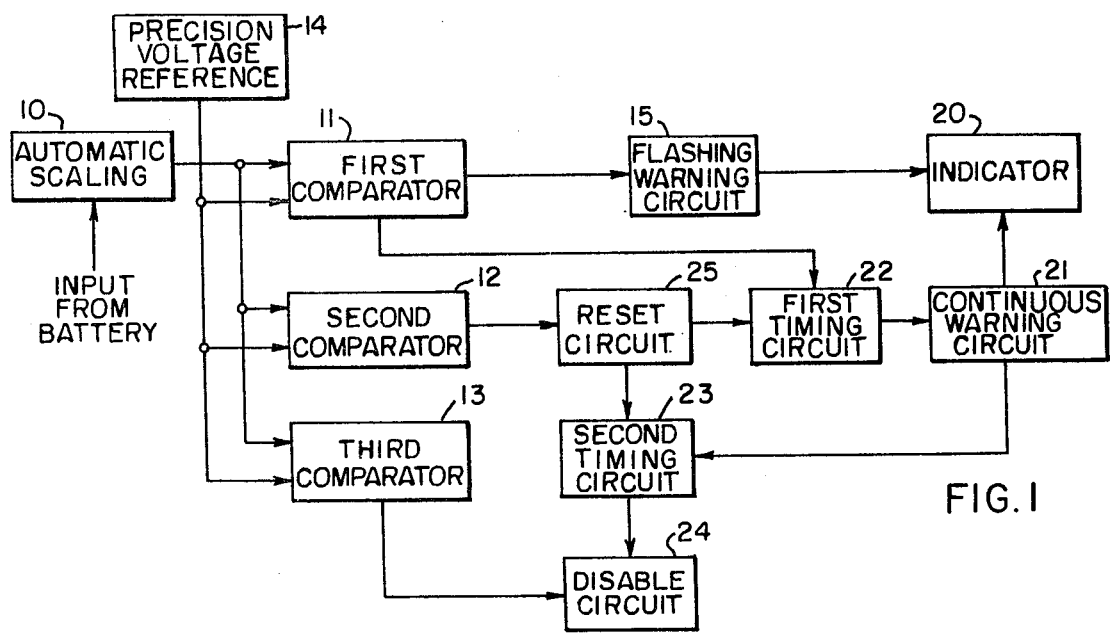
FIG. 1 is a functional block diagram of the monitor.

FIG. 1 is a functional block diagram of the monitor. The voltage from the battery is coupled to an automatic scaling circuit 10. The output voltage of the automatic scaling circuit 10 is a predetermined fraction of the terminal voltage of the battery and is coupled to the first input terminals of first, second and third comparators, respectively illustrated at reference numerals 11, 12, and 13. The automatic scaling circuit 10 includes sensing and attenuating circuitry which automatically adjusts the range of the automatic scaling circuit such that the amplitude of the input signal to the comparators is appropriate for the actual terminal voltage of the battery being monitored. For example the monitor could be designed to have two ranges selected to monitor batteries having a maximum terminal voltage of either 36 or 48 volts.

When the monitor is connected to a battery the automatic scaling circuitry 10 adjusts an attenuator circuit to monitor a battery having a terminal voltage equal to the lowest voltage range of the monitor. The output voltage of the attenuator is sampled and if the voltage exceeds a predetermined threshold the attenuator is stepped to the next highest range. This step is repeated until the range of the monitor matches the battery voltage.

Figure 3:
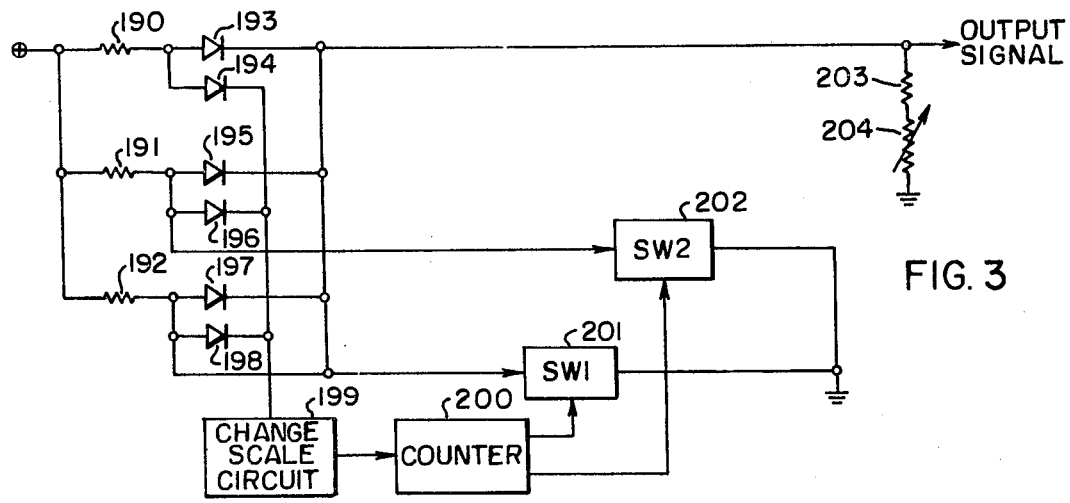
FIG. 3 is a functional block diagram of the automatic scaling circuits.
Figure 2:
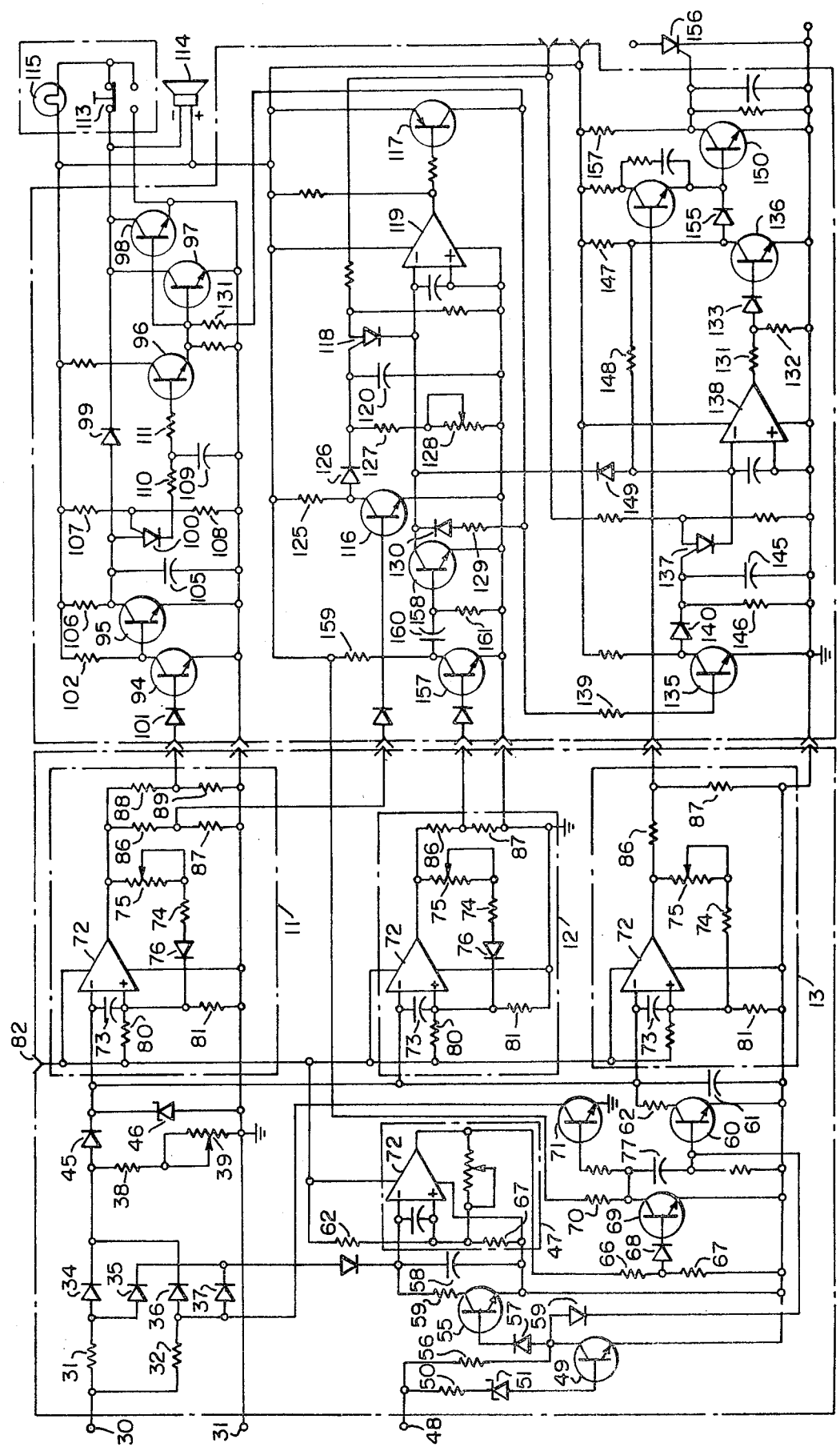
FIG. 2 is a schematic diagram of the automatic scaling circuit, the threshold circuits, the timing circuits, and the warning circuits.

Conceptually the monitor may be designed to include any number of monitoring ranges. FIG. 3 illustrates in functional block diagram form a monitor for monitoring batteries having three different terminal voltages. FIG. 2 is a detailed schematic diagram of a circuit for monitoring batteries having two different terminal voltages. FIG. 2 illustrates the preferred embodiment of the invention.

The output signal of the automatic scaling circuit 10 is coupled to the first input terminal of the first, second, and third comparators, 11, 12 and 13. The second input to each of the comparators is provided by a precision voltage reference source 14. This reference source is a part of the power supply circuit which will be discussed in detail later. Each of the comparators normally includes an additional voltage divider circuit which scales the output voltage of the precision reference source 14 down to generate the different thresholds for the various comparators. The comparators are designed such that they have both high and low thresholds permitting each comparator to generate an output signal which indicates that the battery voltage has exceeded the high threshold or dropped below the low threshold level. The details of these comparator circuits will be discussed later.

The first comparator 11 generates two output signals. These signals are basically identical. Two signals are provided to isolate the circuits utilizing these signals from each other. Each of these signals has two levels, (high and low) with the high level being turned on when the battery voltage falls below the second threshold level and the low level being turned on when the battery voltage exceeds the third threshold level. One of the signals is coupled to the flashing warning circuit 15. Whenever the battery voltage falls below a second threshold the output signal of the first comparator 11 switches to its high state and initiates a circuit which generates a first warning signal which is coupled to the indicator 20. When this first warning signal is present a light 115 (FIG. 3) associated with the indicator 20 will alternately flash on and off.

The first warning signal is terminated when the first output signal of the comparator 11 switches to the low state indicating that the battery voltage has increased above the third threshold or whenever the continuous warning circuit 21 is initiated.

The second output signal from the first comparator 11 is coupled to a first timing circuit 22. This circuit is activated by the high level of the output signal of the first comparator 11. The first timing circuit generates a signal which specifies a time interval during which the battery voltage must rise above the third threshold level or the continuous warning circuit 21 will be activated. If the battery voltage does not exceed the third threshold value within this interval, the continuous warning signal is turned on and the flashing warning is turned off.

A second timing circuit 23 is initiated simultaneous with the initiation of the continuous warning. This timing circuit generates a signal which specifies a second time interval during which the terminal voltage of the battery must rise above the fourth threshold, determined by the second comparator 12, or the selected operative function of the vehicle will be disabled. If the second time interval expires and the voltage of the battery has not exceeded this threshold, the disabled circuit 24 will be initiated causing the selected operative function of the vehicle to be disabled. Alternatively, if the voltage of the battery does exceed this threshold within this time interval, the second comparator 12 will generate a signal which initiates the reset circuit 25. The reset circuit will then generate a signal which resets the first and second timing circuits, 22 and 23, to cancel the warning signals and restore normal operation.

After the selected operative function of the vehicle has been disabled because the warning signals have persisted for the specified time interval the battery voltage must rise above the fourth threshold level determined by the second comparator 12 before the disabled circuit 24 will permit the disabled feature to be reenabled. The thresholds are adjustable.

The third comparator 13 operates in conjunction with the disable circuit 24 to disable the selected operative function of the vehicle and the above monitoring functions until a charged battery has been installed in the vehicle. This is accomplished by continuously comparing the battery voltage to the first threshold and holding the selected operative function in a disabled state until this threshold is exceeded. The operative function is also disabled without substantial delay if the battery voltage falls below the fifth or low threshold of this circuit. The low threshold of this circuit is normally set below the lowest terminal voltage expected during normal operation. If the selected operative function is disabled by this circuit, the battery voltaage must rise above the first threshold before the operative function is reenabled.

Figure 4:
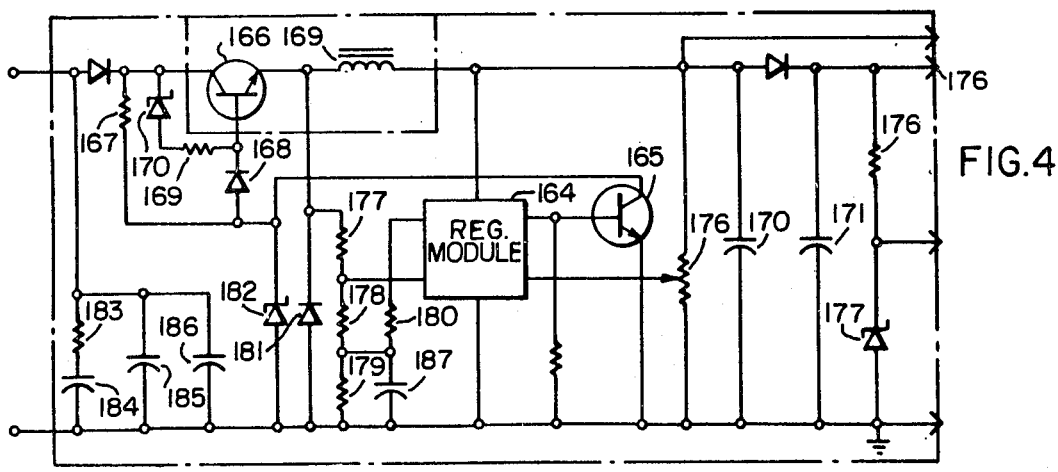
FIG. 4 is a schematic diagram for the power supply utilized by the monitor.

FIG. 3 is a schematic diagram of the monitor except for the power supply. FIG. 4 is a schematic diagram of the power supply utilized by the monitor.

Many of the components of the schematic diagram (FIG. 3) are associated with more than one of the functions illustrated in FIG. 1. For this reason, this schematic diagram has not been rigorously divided into functional blocks corresponding to FIG. 1.

The circuit illustrated in FIG. 3 includes automatic scaling circuitry permitting the monitor to automatically change range. The circuit includes two monitoring ranges. For example, first range might be designed to monitor 36 volt batteries while the second range might be designed to monitor 36 volt batteries. Although only two ranges are illustrated in the detailed schematic of the monitor, the circuitry can be expanded to include three or more ranges. Circuitry illustrating in how this can be done will be discussed in detail later.

The positive and negative terminals, 30 and 31, of the monitor are coupled to the positive and negative terminals of the battery to be monitored and to a voltage divider network comprising a plurality of resistors and diodes. The diodes function as switches to change the impedance of the divider network which in turn changes the voltage output of the network. The output signal of this network is one input to comparator circuits.

More specifically, the positive terminal of the battery is coupled to input terminal 30 which is in turn coupled to the common junction of two range select resistors, 31 and 32. The second end of the first range select resistor, 31 is coupled to the positive terminal of first and second isolation and switching diodes, 34 and 35. The second terminal of the second range select resistor 32 is coupled to the positive terminal of third and fourth range selection and isolation diodes, 36 and 37. The negative terminal of the first and third isolation diodes, 34 and 36, are connected in parallel. The negative terminals of the second and fourth switching and isolation diodes, 35 and 37, are similarly connected. Two series connected resistors, 38 and 39, are connected between the negative terminals of the first and third isolation diodes 34 and 36 and the ground terminal of the circuit. A conventional diode and a Zener diode, 45 and 46, are connected in series. The series combination of these diodes is connected in parallel with the resistor network comprising two series coupled resistors, 38 and 39. The junction formed by connecting the isolation diode 45 to the Zener diode 46 forms the output terminal of the automatic scaling network. This terminal is coupled to the negative input terminal of the first, second and third comparators 11, 12 and 13.

The polarity protection diode 45 protects the comparators from reverse plurality voltages while the Zener diode 46 protects the comparators from voltages exceeding the maximum input voltage rating of the comparators. The range selection and isolation diodes 34 through 37 permit the range selection resistors 31 and 32 to be switched in and out to change the operating range of the monitor.

In the illustrated circuit the range is switched from the low range to the high range by signals generated by the automatic range comparator 47. This switching function accomplished by coupling the positive terminals of isolation diodes 36 and 37 to ground through a low impedance when the output voltage of the automatic range selection circuit exceeds a value which would normally be expected to be encountered when the circuit is coupled to a battery having a terminal voltage within the low range of the monitor. The only time this will occur is when a battery having a terminal voltage above the low range is coupled to the monitor.

The circuits illustrated in FIG. 3 derive their normal operating voltages from the power supply illustrated in FIG. 4. A positive output voltage from the power supply illustrated in FIG. 4 is coupled to power supply sensor terminal 48. The voltage appearing at this terminal is coupled to the base of the first transistor 49 through the series combination of a resistor and Zener diode 50 and 51.

This voltage is also coupled to the input of a second transistor 55 through the series combination of a resistor and a diode 56 and 57. The breakdown voltage of the Zener diode 51 is selected such that when the monitor circuit is connected to a battery that the second transistor 55 will come on prior to the first transistor 49. This assures that the second transistor 55 will discharge a filter capacitor 58 through a discharge resistor 59 before the first transistor 49 begins conducting.

When the Zener diode 51 breaks down the first transistor 49 will begin conducting causing the voltage at the collector of this transistor to be reduced to a point which causes the second transistor 55 to be cut off. The collector of the first transistor is also coupled by a coupling diode 59 to the input of a third transistor 60. This transistor discharges a filter capacitor 61 through a resistor 62 in a manner similar to that previously described with respect to filter capacitor 58.

Filter capacitor 58 assures that high frequency transits appearing at the input terminals of the automatic range comparator 47 will be filtered to a degree sufficient to assure that this comparator is not upset by transients. Filter capacitor 61 performs a similar function with respect to the output voltage of the automatic range circuit. It is necessary to discharge these capacitors, as described above, whenever the battery is removed from the vehicle in order to assure that the various comparator circuits begin operation in a known condition.

As discussed above filter capacitor 58 is discharged through resistor 59 and transistor 55. This capacitor is connected from the negative input terminal of the comparator amplifier to the ground terminal of the circuit. The filter capacitor is selected such that the voltage appearing at the negative terminal of the comparator amplifier rises at a slower rate than the voltage coupled to the positive terminal of this amplifier. This assures that at the beginning of the cycle the output voltage of the comparator amplifier will be high or positive. This causes the automatic scaling circuitry to begin operation in the low range. This positive voltage is coupled to the base of an amplifier transistor 69 by a network consisting of two series couple resistors 66 and 67 and a diode 68. This positive voltage causes this amplifier transistor 69 to conduct. The voltage drop across the collector resistor 70 causes the collector terminal voltage of transistor 69 to drop to a value of which causes a switching transistor 71 to cut off. The collector terminal of the switching transistor 71 is coupled to the positive terminal of the two low range isolation diodes 36 and 37. However, since the switching transistor 71 is non-conducting it has essentially no effect on the ranging circuit causing the ranging resistors 31 and 32 to be effectively connected in parallel. This reduces the ranging network to two series connected resistors with the first resistor being the parallel combination of the range resistors 31 and 32 and the second resistor being the series combination of two resistors 38 and 39.

The low voltage end of the range resistors 31 and 32 are respectively coupled by isolation diodes 35 and 36 to the negative inputs of the automatic ranging comparison circuit 47. When this voltage rises above the voltage coupled to the positive input terminal of the ranging comparator 47 the output signal of this comparator changes from positive to negative. This negative signal causes the switching transistor 71 to be turned on. When the switching transistor 71 becomes highly conductive the positive terminals of isolation diodes 36 and 37 are coupled to ground through the low impedance of the switching transistor 71. This causes the third isolation diode 36 to be reverse bias and in effect removes the second ranging transistor 32 from the input circuit. This causes a larger proportion of the battery voltage coupled to terminal 30 to appear across the first ranging transistor 31 thereby increasing the range of the monitoring circuit.

The positive going voltage at the collector of transistor 69 is also coupled to the base of transistor 60 by a coupling capacitor 77. This positive going pulse turns on transistor 60 to discharge filter capacitor 61. This causes the three other comparators, 11, 12 and 13 to switch back to their beginning state. This is important because a partially discharged high voltage battery may have a voltage which is sufficient to cause comparator 13 to generate a signal which enables the selected operative function while the monitor was on the low but improper scale but which is insufficient to enable this function when the monitor is on the proper scale.

The four comparators 11, 12, 13 and 47 used in the circuit illustrated in FIG. 3 are essentially identical. Therefore the first comparator 11 will be discussed in detail. The operation of the other comparators should be obvious in view of the discussion of the first comparator. Similar components in the various comparators are labeled with the same reference numerals. It is believed that this will aid in understanding the similarities between the comparators.

The first comparator is illustrated in reference numeral 11 in FIG. 3. The basic comparator comprises a differential amplifier 72 a feedback network, a divider network coupled to the one input of the differential amplifier 72, and a filter capacitor 73. The feedback network comprises a fixed resistor 74 in series with the variable resistor 75 and a diode 76. The divider network comprises two resistors 80 and 81. The resistor divider network is coupled between a reference voltage input terminal 82 and the ground terminal of the comparator. The junction formed by series connecting these resistors is coupled to the positive input terminal of the differential amplifier 72 and the feedback network is coupled between the output and the positive input terminal of the amplifier 72. The gain of the amplifier 72 is high and the feedback is positive. This causes the comparator to function as a memory. The output signal of the comparator is a two-level signal with the signal changing from one level to the other depending on the relative amplitude of the voltages appearing at the input terminals of the comparator. The positive and negative threshold voltages of the comparator 11 are independently adjustable. For example, the positive threshold is basically determined by the value of the resistors comprising the feedback network, 74 and 75. The negative threshold is basically determined by the resistor divider network. Thus the positive threshold can be adjusted without substantially effecting the negative theshold by varying the variable resistor 75. This separation of the threshold adjustments is possible because when the output signal of the amplifier 72 is negative the diode 76 and the feedback network is reversed bias. This reduces the feedback to zero making the negative threshold a function of the input divider comprising resistors 80 and 81. By suitably selecting the components of the feedback and divider network the negative and positive thresholds of this comparator can be independently adjusted over a wide range.

It is desirable to have two outputs from the first comparator 11 with the output signals having a reasonable degree of isolation between each other. This is accomplished by connecting two series resistor divider networks across the output of the amplifier 72 and using the output of these dividers as the output signals of the first comparator 11. The resistors comprising these networks are shown at reference numerals 86 through 89. The second comparator 12 is essentially identical with the first comparator 11 except that only one output signal is desired and therefore only one resistor divider network is coupled across the output of the amplifier. The third comparator 13 is also similar to the first comparator 11 except that the diode and feedback network has been eliminated since it is only the high threshold level that must be accurately set. The comparator 47 utilized by the automatic scaling circuit is also similar to the first, second and third comparators. Because of these similarities it is believed to be unnecessary to discuss the detailed operation of the other comparators.

The first output signal of the first comparator 11 is coupled to the input of a circuit which drives the flashing warning indicator. This circuit includes transistors 94 through 98, a feedback diode 99, and a unijunction transistor 100.

The first threshold level of the first comparator 11 is normally adjusted such that when the battery voltage is within the normal operating range the output signal of the first comparator 11 is low. This output signal is coupled to the input transistor 94 of the flashing warning circuit through a coupling diode 101. The low value of this signal causes the input transistor 94 to be turned off. Turning off this transistor causes the second transistor 95 to be biased into the highly conductive region by base current which flows through the collector resistor 102 of the input transistor 94. This highly conductive transistor forms a short circuit across a timing capacitor 105. This is the timing capacitor for the circuit which generates the on and off signals to operate the flashing warning indicator. Holding this capacitor 105 in a discharged state disables the flashing circuit holding the flashing warning in the off condition.

When the battery voltage falls below the second threshold the output signal of the first comparator 11 goes high turning the input transistor 94 on and the second transistor 95 off. When the second transistor 95 is turned off the timing capacitor 105 begins to charge through the collector resistor 106 of the second transistor 95. The unijunction transistor 100 triggers when the timing capacitor 105 accumulates sufficient charge to cause the voltage drop across this capacitor to rise to the trigger point of the unijunction transistor 100. The trigger level of the unijunction transistor 100 is determined by a resistor bias network comprising two resistors 107 and 108. When the unijunction transistor 100 triggers a second capacitor 109 is charged through a resistor 110. The voltage across capacitor 109 is coupled to the base of transistor 96 by a resistor 111. When this capacitor has accumulated sufficient charge the third transistor 96 will begin conducting and turn on to parallel connected output transistors 97 and 98. When the two output transistors turn on the first timing capacitor 105 will be discharged rather rapidly through a feedback diode 99. This causes the unijunction transistor 100 to turn off. However the output transistors 97 and 98 will not be turned off immediately because sufficient charge has accumulated on the second capacitor 109 to hold these transistors on for a brief period of time. This causes the circuit to oscillate alternately turning on and off a flashing light 115 to generate the previously described flashing warning signal. This warning will continue until it is either terminated by the battery voltage coupled to the first comparator rising above the third threshold or by the beginning of the steady warning signal to be subsequently described.

An audible warning device 114 is also connected in parallel with the light 115. A switch 113 permits these warning devices to be tested in the absence of a warning signal.

The second output signal from the first comparator 11 is coupled to the input of the first timing circuit, 22. This timing circuit is triggered substantially coincident in time with the beginning of the flashing warning signal. At the end of the time interval determined by this circuit, the flashing warning will be terminated and the steady warning signal will be initiated provided the battery voltage has not increased above the third threshold level.

The first timing circuit 22 includes two transistors an operational amplifier, a unijunction transistor, and associated resistors and capacitors. The transistors are illustrated at reference numerals 116 and 117. The operational amplifier and the unijunction are respectively illustrated at reference numerals 118 and 119.

When the terminal voltage of the battery being monitored exceeds the third threshold level the output signal from the first comparator 11 switches to its low state causing the input transistor 116 of the first timing circuit 22 to be biased off. This causes the timing capacitor 120 to charge through the collector resistor 125 and the isolation diode 126. The timing capacitor 120 will be charged to a voltage which is sufficient to bias the unijunction transistor 118 to the off condition. This disables the first timing circuit 22.

When the battery voltage falls below the second threshold the output signal of the first comparator 11 switches to its high state turning on the input transistor 116. This causes the collector terminal of this transistor to go low thereby reducing the charging current which normally flows through the collector resistor 125 of the first transistor to essentially zero. Discharge of the timing capacitor 120 by the input transistor 116 is prevented by the isolation diode 126 which becomes reverse bias when the input transistor 116 is turned on. After the isolation diode 126 becomes reverse bias the timing capacitor 120 begins to discharge through two series connected resistors, 127 and 128. When the voltage across the timing capacitor 120 falls below the trigger point of the unijunction transistor 118, this unijunction triggers causing the output of amplifier 119 to go low. The low output voltage of this amplifier turns on the output transistor 117. The collector of the output transistor 117 is coupled to the positive input terminal of the amplifier 119 by a series diode resistor network comprising a resistor 129 and a diode 130. This feedback is positive causing the output signal of the amplifier 119 to remain high and retains the output transistor 117 and the highly conductive state.

The collector terminal of the output transistor 117 is also coupled to the base terminal of the two parallel connected transistors, 97 and 98, through a resistor 131. When the output transistor 117 becomes highly conductive a steady signal is applied to the base terminals of these transistors, 97 and 98, causing the warning light 115 to operate continuously thereby generating the continuous warning signal. The continuous warning signal will remain on until the battery voltage rises above the fourth threshold determined by comparator 12.

This is accomplished by feeding back the output signal from transistor 117 via resistor 129 and diode 130 into comparator 119 to latch up this comparator. This effectively inhibits the reset action of the (first) comparator 72 which would result when the voltage rose above the third threshold level. The circuit is reset only when the voltage rises above the fourth threshold. Once reset, the circuit would then respond, as previously described, to the second and third voltage levels provided the first time delay limit has not been exceeded.

The output signal of the first timing circuit 22 is also coupled to the inputs of a second timing circuit 23 such that the second timing circuit 23 is initiated when the steady warning indicator is turned on. This second timing circuit comprises an input transistor 135 and an output transistor 136, a unijunction transistor 137 and a differential amplifier 138. When the steady warning indicator is turned on, as previously described above, the collector of transistor 117 goes positive. This positive voltage is coupled to the base of the input transistor 135 of the second timing circuit through an input resistor 139. This causes the input transistor 135 to become highly conductive causing the collector terminal of this transistor to be approximately zero volts with respect to ground. This reverse biases and isolation diode 140 permits the timing capacitor 145 to begin discharging through the timing resistor 146. When the voltage across the timing capacitor 145 falls below the trigger point of the unijunction transistor 137, the unijunction triggers thereby providing a signal to the positive input of amplifier 138. This signal causes the output signal of this amplifier to go high.

The high output signal of differential amplifier 138 is coupled to the base of transistor 136 by a network comprising resistors 131 and 132 and diode 133 thereby causing the output transistor 136 to become highly conductive. Positive feedback to the positive input terminal of amplifier 138 from the collector of the output transistor 136 is provided by the feedback resistors 147 and 148. This feedback causes the amplifier 138 and the output transistor 136 to function as a memory circuit. A reset signal is also coupled from the reset circuit to this circuit by an isolation diode 149.

When the output transistor 136 of the second timing circuit 23 becomes highly conductive, indicating that the timing interval specified by this circuit has expired, an SCR drive transistor 150 coupled to the collector of this transistor through a coupling diode 155 becomes highly conductive depriving the SCR 156 of its gate drive current because of the increased voltage drop across the collector resistor 157. This turns off the SCR 156 and disables the selected operable function of the vehicle. Operation can only be restored when the battery voltage rises above the fourth threshold level.

The above disabled sequence may be interrupted by a reset signal which resets both the warning and timing circuits if the battery voltage rises above the fourth threshold level before the expiration of the time interval specified by the second timing circuit 23. The output signal of the second comparator 12 initiates a reset circuit 25 to generate this signal.

The output signal of the second comparator 12 is coupled to the reset circuit 25 comprising two transistors, 157 and 158. The lower threshold level of the second comparator 12 is set to be practically the same as the lower threshold level of the first comparator 11. Therefore when the first timing circuit is initiated the output signal of the second comparator will go high causing the input transistor 157 of the reset circuit to become highly conductive. The collector voltage of this transistor 157 drops to a low value due to the current through its collector resistor 159. If the battery voltage rises above the fourth threshold, indicating that the timing and warning circuits should be reset to prevent a disable signal from being generated, the output signal of the second comparator 12 will go negative causing the input transistor 157 to turn off. Turning off this transistor causes a positive signal to be coupled to the base of the second transistor 158 of this circuit through coupling capacitor 160 and bias resistor 161. This causes the output transistor 158 to become highly conductive generating a negative going reset signal which is coupled to the input of amplifier 119 of the first timing circuit 22 and amplifier 138 of the second timing circuit 23 causing these circuits to be reset thereby restoring normal operation.

FIG. 3 is a diagram illustrating how the automatic scaling circuit can be extended to three ranges. The circuit includes three range resistors, 190, 191, and 192. The circuit switches to the lowest range when the plus input terminal is connected to the battery to be monitored is connected to the circuit. In the low range, all the switching and isolation diodes, 193 through 198, are forward biased. The input impedance of the change scale circuit, 199, and the switches, 201 and 202, is high causing these elements to draw very little current. Under these conditions, the range resistors 190, 191 and 192 are effectively connected in parallel. This forms a voltage divider network comprising the parallel combination of the range resistor, 190, 191 and 192, and the series combination of resistors 203 and 204.

In the low range, all the diodes 194, 196 and 198, which couple the low voltage end of the range resistors to the change scale circuit 199 will be forward biased. This causes the voltage coupled to the change scale circuit 199 to be equal to the output signal except for the voltage drop across a forward biased diode.

The voltage coupled to the change scale circuit 199 is compared to a reference voltage. If this voltage exceeds the reference, the battery voltage is too high for the low scale and the change scale circuit increments a counter 200 one count. This turns a switch SW1 causing it to switch to a low impedance state. This effectively grounds the low voltage end of third ranging resistor 192 and reverse biases the associated isolation diodes 197 and 198. Reverse biasing these diodes effectively removes the third ranging resistor 192 from the circuit and reduces the amplitude of the output signal. The input voltage to the change scale circuit is again compared to the reference and if exceeds the reference, the counter 200 is again incremented turning on switch SW2. This in effect removes the second ranging resistor 191 from the circuit and again increases the range of the circuit. This procedure is repeated until the range of the monitor corresponds to the battery voltage. This circuit can be expanded to include any desired number of ranges.

In general, each of the ranges will correspond to the maximum terminal voltage of a battery to be monitored. In the illustrated example the ranges might correspond to battery voltages of 24, 36 and 48 volts.

The monitor and alarm circuits discussed above are supplied with DC operating voltages from a power supply illustrated in FIG. 4. The illustrated power supply utilizes an integrated circuit switching mode regulator module 164. This module may be a commercially available model No. 723 manufactured by Texas Instruments. The output of the switching regulating module 164 is coupled to an amplifier transistor 165. The collector of this transistor is coupled to a regulator transistor 166 by a resistor 167 and a diode 168. The base to collector junction of this transistor 166 is by-passed by the series combination of a resistor 169 and a Zener diode 170. This by-pass of the base to collector junction of this transistor prevents it from being damaged by high voltage switching transients which may be present on the battery terminal voltage.

The emitter of the regulator transistor 166 is coupled to an inductor 169. The inductor 169 in conjunction with the filter capacitors 170 and 171 removes substantially all of the AC components of the output current from the regulator transistor 166. The collector supply voltage for the circuits illustrated in FIG. 3 is available at terminal 175. The precision supply voltage for the comparators and the delay circuits is obtained by dividing down the collector supply voltage by a series circuit comprising a resistor and Zener diodes 176 and 177.

The output voltage of the power supply is determined by an adjustable resistor 176. Bias voltages are supplied to the regulator module by a network comprising resistors 177 through 180 and a Zener diode 181 limits the bias voltage to a safe value. Another Zener diode 182 is coupled between the collector and emitter terminals of the amplifier transistor 165 to assure that high voltage transit which may be superimposed on the battery voltage will not exceed the base to emitter rate in this transistor. Transits on the battery voltage are further reduced by a filter network comprising a resistor 183 and filter capacitors 184 through 186. A filter capacitor 187 reduces transients superimposed on the regulator module 164 bias voltages.

I claim:

1. A circuit for monitoring the terminal voltage of an electrical energy source for an electrically powered vehicle, comprising in combination: (a) automatic scaling means for monitoring the terminal voltage of said energy source and adjusting an attenuator to a range appropriate for the energy source being monitored to produce a first signal, said first signal having a predetermined relationship to the terminal voltage of said energy source, said scaling means also including a filter to assure that said range changing means does not respond to rapid changes in the terminal voltage of said energy source; (b.) comparator and timing means for comparing the magnitude of said first signal to a reference signal to determine if said first signal decreases below a first predetermined level and remains below a second predetermined level for a predetermined time interval to generate and initiate disable signal; and (c) first disable means for disabling a selected operative function of said vehicle in response to said initiate disable signal.

2. The circuit defined by claim 1 further including means for initiating a warning signal whenever said first signal is below said first predetermined level.

3. The circuit defined by claim 1 further including means for retaining a selected operative function of the vehicle in a disabled condition until the terminal voltage of said energy source exceeds a second predetermined level.

4. The circuit defined by claim 3 further including second disable means for disabling said selected operative function without substantial delay if the terminal voltage of said battery falls below a third predetermined level.

5. The circuit defined by claim 1 wherein said automatic scaling circuit comprises:

a. first and second resistance resistors series coupled to form a divider network;
b. switching means permitting the current flowing in selected elements of said first network to relatively flow through said second network to change the scale of said attenuator.

6. A circuit for monitoring the terminal voltage of an electrical energy source for an electrically powered vehicle, comprising in combination: (a) automatic scaling means for monitoring the terminal voltage of said energy source and for adjusting an attenuator to produce a first signal, said first signal having a predetermined relationship to the terminal voltage of said energy source, said scaling means also including a filter to assure that said range changing means does not respond to rapid changes in the terminal voltage of said energy source; (b) compare and timing means for comparing the magnitude of said first signal to a second signal to determine if the terminal voltage of said energy source decreases below a first predetermined value and remains below a second predetermined level for a predetermined time interval to generate a disable initiate signa; (c) first disable means for selectively disabling a selected operative function of said vehicle in response to said disable initiate signal; and (d) means for selectively re-enabling said selected operative function if the terminal voltage of said energy source exceeds a third predetermined level.

7. A circuit for monitoring the terminal voltage of an electrical energy source for an electrically powered vehicle, comprising in combination: (a) automatic scaling means for monitoring the terminal voltage of said energy source and for adjusting an attenuator to produce a first signal, said first signal having a predetermined relationship to the terminal voltage of said energy source; (b) means for delaying the operation of a selected function of said vehicle until said automatic scaling means determines the expected terminal voltage of said energy source; (c) compare and timing means for comparing the magnitude of said first signal to a reference signal to determine if the terminal voltage of said energy source decreases below a first predetermined value and remains below a predetermined level for a predetermined time interval to generate a disable ititiate signal; (d) first disable means for selectively disabling a selected operative function of said vehicle in response to said disable initiate signal.

8. A circuit for monitoring the terminal voltage of an electrical energy source for an electrically powered vehicle, comprising in combination; (a) automatic scaling means for monitoring the terminal voltage of said energy source and for adjusting an attenuator to produce a first signal, said first signal having a predetermined relationship to the terminal voltage of said energy source, (b) means for delaying the operation of a selected function of said vehicle until said automatic scaling means determines the expected terminal voltage of said energy source; (c) compare and timing means for comparing the magnitude of said first signal to a second signal to determine if said first signal decreases below a first predetermined value and remains below a second predetermined level for a predetermined time interval to generate a disable initiate signal; (d) first disable means for selectively disabling a selected operative function of said vehicle in response to said disable initiate signal; and (e) means for selectively re-enabling said selected operative function if the terminal voltage of said energy source exceeds a predetermined level.

9. A circuit for monitoring the terminal voltage of an electrical energy source for electrically powered apparatus comprising in combination: (a) automatic scaling means for monitoring the terminal voltage of said energy source and for adjusting an attenuator to produce a first signal, said first signal having a predetermined relationship to the terminal voltage of said energy source; (b) means for delaying the operation of a selected function of said electrically powered apparatus until said automatic scaling means determines the expected terminal voltage of said energy source; (c) compare and timing means for comparing the magnitude of said first signal to a second signal to determine if the terminal voltage of said energy source decreases below a first predetermined value and remains below a second predetermined level for a predetermined time interval to generate a disable initiate signal; (d) first disable means for selectively disabling a selected operative function of said vehicle in response to said disable initiate signal; and (e) means for selectively re-enabling said selected operative function if the terminal voltage of said energy source exceeds a third predetermined level.

* * * * *